United States Patent
Gattiker et al.

(10) Patent No.: US 7,759,960 B2
(45) Date of Patent: *Jul. 20, 2010

(54) INTEGRATED CIRCUIT TESTING METHODS USING WELL BIAS MODIFICATION

(75) Inventors: Anne E. Gattiker, Austin, TX (US);
David A. Grosch, Burlington, VT (US);
Marc D. Knox, Hinesburg, VT (US);
Franco Motika, Hopewell Junction, NY (US); Phil Nigh, Williston, VT (US);
Jody Van Horn, Underhill, VT (US);
Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 49 days.

This patent is subject to a terminal disclaimer.

(21) Appl. No.: 12/103,906

(22) Filed: Apr. 16, 2008

(65) Prior Publication Data
US 2008/0211530 A1    Sep. 4, 2008

Related U.S. Application Data (62) Division of application No. 10/539,247, filed on Jun. 16, 2005, now Pat. No. 7,400,162.

(51) Int. Cl.
*G01R 31/26* (2006.01)
(52) U.S. Cl. .................................... 324/765; 324/158.1
(58) Field of Classification Search ........................ None
See application file for complete search history.

(56) References Cited

U.S. PATENT DOCUMENTS

| 5,327,075 A | 7/1994 | Hashinaga et al. |
| 5,371,457 A | 12/1994 | Lipp |
| 5,392,293 A | 2/1995 | Hsue |
| 5,406,212 A | 4/1995 | Hashinaga et al. |
| 5,625,300 A | 4/1997 | Sachdev |

(Continued)

FOREIGN PATENT DOCUMENTS

JP    3044580 A    2/1991

(Continued)

OTHER PUBLICATIONS

Keshavarzi et al., "Intrinsic Leakage in Low Power Deep Submiron CMOS ICs," IEEE International Test Conference, 1997, pp. 146-155.

(Continued)

*Primary Examiner*—Vinh P Nguyen
(74) *Attorney, Agent, or Firm*—Joseph Abate; Hoffman Warnick LLC (57) ABSTRACT

Methods for testing a semiconductor circuit (10) including testing the circuit and modifying a well bias (14, 18) of the circuit during testing. The methods improve the resolution of voltage-based and IDDQ testing and diagnosis by modifying well bias during testing. In addition, the methods provide more efficient stresses during stress testing. The methods apply to ICs where the semiconductor well (wells and/or substrates) are wired separately from the chip VDD and GND, allowing for external control (40) of the well potentials during test. In general, the methods rely on using the well bias to change transistor threshold voltages.

24 Claims, 4 Drawing Sheets

U.S. PATENT DOCUMENTS

| | | | |
|---|---|---|---|
| 5,838,047 | A | 11/1998 | Yamauchi et al. |
| 5,880,593 | A | 3/1999 | Gilliam |
| 5,889,408 | A | 3/1999 | Miller |
| 5,986,461 | A | 11/1999 | Kalb, Jr. |
| 6,144,214 | A | 11/2000 | Athan |
| 6,239,605 | B1 | 5/2001 | Miller |
| 6,239,606 | B1 | 5/2001 | Miller |
| 6,249,134 | B1 | 6/2001 | Umeki |
| 6,262,588 | B1 | 7/2001 | Chen |
| 6,301,168 | B1 | 10/2001 | Crocker |
| 6,330,697 | B1 | 12/2001 | Clinton et al. |
| 6,489,800 | B1 | 12/2002 | Dallavalle |
| 6,715,090 | B1 | 3/2004 | Totsuka et al. |
| 6,777,978 | B2 | 8/2004 | Hart et al. |
| 6,900,656 | B1 | 5/2005 | Houston et al. |
| 7,060,566 | B2 | 6/2006 | Vogelsang |
| 7,274,247 | B2 | 9/2007 | Ward et al. |
| 7,400,162 | B2 * | 7/2008 | Gattiker et al. ............ 324/765 |
| 2003/0053335 | A1 | 3/2003 | Hart et al. |
| 2006/0220726 | A1 | 10/2006 | Ward et al. |

FOREIGN PATENT DOCUMENTS

| | | |
|---|---|---|
| WO | 9516923 | 6/1995 |

OTHER PUBLICATIONS

Sato et al., "An Evaluation of Defect-Oriented Test: WELL-controlled Low Voltage Test," IEEE ITC International Test Conference, 2001, pp. 1059-1067.

Ferro et al., "Quienscent Power Supply Current Test for CMOS Integrated Circuits Using Non-Complementary Pass Gate Logic," IBM Technical Disclosure Bulletin, vol. 35, No. 1B, Jun. 1992, pp. 354-358.

Gattiker et al., U.S. Appl. No. 10/539,247, Notice of Allowance and Fees Due, Mar. 6, 2008, 11 pages.

Gattiker et al., U.S. Appl. No. 10/539,247, Office Action Communication, Jan. 22, 2007, 8 pages.

Gattiker et al., U.S. Appl. No. 10/539,247, Office Action Communication, Jun. 11, 2007, 6 pages.

Gattiker et al., U.S. Appl. No. 11/876,066, Notice of Allowance and Fees Due, Sep. 24, 2008, 6 pages.

Gattiker et al., U.S. Appl. No. 11/876,066, Office Action Communication, Mar. 20, 2008, 18 pages.

Gattiker et al., U.S. Appl. No. 12/119,834, Notice of Allowance and Fees Due, Mar. 16, 2009, 11 pages.

CN 038260093, Office Action Communcation and English Summary, Nov. 1, 2009, 8 pgs.

* cited by examiner

PRIOR ART

INTEGRATED CIRCUIT TESTING METHODS USING WELL BIAS MODIFICATION

This application is a divisional of U.S. patent application Ser. No. 10/539,247, filed on Jun. 16, 2005, now U.S. Pat No. 7,400,162.

TECHNICAL FIELD

The present invention relates generally to integrated circuit testing.

BACKGROUND ART

A goal of integrated circuit (IC) testing is to distinguish defect-free devices from those that have defects. Many commonly occurring defects, however, are difficult to detect and characterize during traditional testing. In particular, there are a number of defects that are difficult to test during voltage-based testing, static leakage current ("IDDQ") testing, and stress-related testing.

Relative to voltage-based testing, testing under nominal well-bias conditions does not always detect defects. For instance, voltage-based testing at nominal well-bias conditions may be completed using a low-Vdd test to aid in detection of defects. However, not all defects are readily apparent using such tests.

Relative to IDDQ testing, increased background currents make it difficult to distinguish between defect-related IDDQ, i.e., those usually manifested in an elevated IDDQ, from normal defect-free chip background current. One proposed solution to this problem is to uniformly modify the well and/or substrate biases so that the threshold voltages of all of the transistors are increased in order to decrease leakage current and make defect-related IDDQ discernable. However, this solution overlooks the relationships between IDDQ and substrate bias that may be leveraged to detect defects. Another proposed solution is IDDQ versus Vdd characterization. Unfortunately, defects are still difficult to discern and characterize based on this comparison.

Relative to stress-related testing, latent defects may exist in manufactured ICs that are initially benign and therefore not detectable at wafer or package level test. However, degradation during use can cause the circuit to fail before the end of its specified life. Accelerated life stress tests are used to detect such defect-related "reliability fails" so that defect-laden ICs are not shipped to the customer. Today, elevated voltage stress tests and elevated temperature/voltage burn-in tests are used as accelerated life stresses. One of the reasons for burning in chips at high voltage and temperature, or voltage stressing chips at high voltage, is to create large currents. Such currents are especially useful for opening up resistive-open-type defects. Another reason for generating high currents is to increase power dissipation, which generates heat and, in turn, mechanical stresses. These mechanical stresses are also especially useful for opening up resistive-open-type defects. Unfortunately, both types of tests are becoming increasingly difficult to apply. First, voltage stress is problematic relative to near-future technologies because placing a large electric field across the gate oxide has increasingly forced the chips into gate oxide failure prematurely. Second, burn-in is also becoming less desirable as power, especially static power, exceeds equipment delivery capabilities. Also, both traditional stress methods disadvantageously require compromises in design to ensure circuit functionality under the applied stresses.

In view of the foregoing, there is a need for IC testing methods that provide higher resolution voltage-based and IDDQ testing and more efficient, less damaging stress testing.

DISCLOSURE OF THE INVENTION

The invention relates to integrated circuit testing. The invention provides methods for testing a semiconductor circuit including testing the circuit and modifying well biases during testing. The methods improve the resolution of voltage-based and IDDQ testing and diagnosis by modifying well biases during test. In addition, the methods provide more efficient, less damaging stresses during stress testing. The methods apply to ICs where the semiconductor bulk nodes (wells and/or substrates) are wired separately from the chip power Vdd and ground GND, allowing for external control of the bulk potentials during test. In general, the methods rely on using the bulk bias to change transistor threshold voltages or place a larger electric field across the gate oxide.

Relative to voltage-based testing, the methods allow standard voltage testing techniques to be used, but provide improved detectability and diagnosability of manufacturing flaws versus tests done under a nominal well-bias condition. Relative to IDDQ testing, independent bulk bias modification takes advantage of the relationship between bulk bias and IDDQ, allows characterization of multiple independent relationships by modifying n-transistor voltage thresholds (Vtn) and p-transistor voltage thresholds (Vtp) separately, allows a wider range of IDDQ without damaging the device with large electric fields across the oxide, and the increased ability to induce jumps in IDDQ due to degraded logic levels exceeding lowered transistor thresholds or falling below increased transistor thresholds.

With regard to stress testing, the methods allow for generation of large currents for stressing a chip without application of a high and damaging electric field across the gate oxide and without necessarily relying on high temperature, i.e., without necessarily requiring a burn-in oven. In addition, because the transistor threshold voltage (Vt) has a strong effect on both switching and static currents, the methods allow tuning the well biases during stress to achieve the desired mix of static and switching currents. Accordingly, it provides a method for improved circuit stress compared to standard voltage stress and burn-in stress techniques. In addition, the methods also help circuits function at stress conditions and allows for localizing and diagnosing defects. The methods can be used to "bump" gate oxide stress and tailor well bias on a chip-by-chip basis during burn-in.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

BEST MODE(S) FOR CARRYING OUT THE INVENTION

Figure 1:
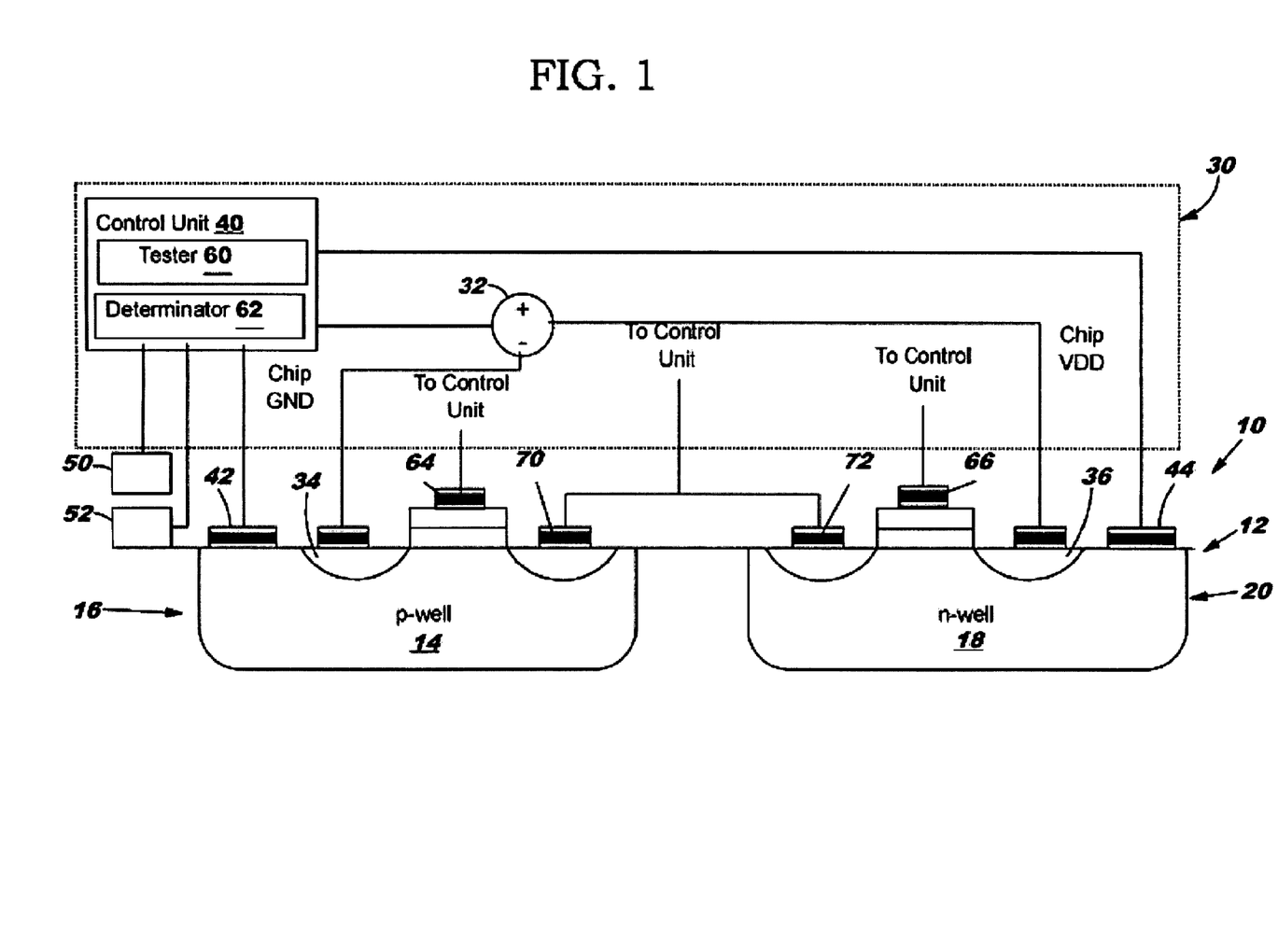
FIG. 1 shows an integrated circuit for testing and a testing system according to an embodiment of the invention.

With reference to the accompanying drawings, FIG. 1 shows an integrated circuit (IC) 10 including semiconductor bulk nodes 12 that are wired separately from the chip power voltage (VDD) and ground (GND), which allows for external control of the bulk bias during test. The methods include testing a circuit 10 including independently modifying a p-well 14 bias of an n-transistor 16 and an n-well 18 bias of a p-transistor 20; and determining whether a defect exists from the testing. As used herein, the term "bulk" or, equivalently, "bulk node," shall refer to both wells and substrates. Similarly, based on the fact that modern digital complementary metal-oxide semiconductor (CMOS) processes rarely use the configuration of a single well and a substrate (i.e., the transistor bulk node is nearly always a well), the term "well" refers to both wells and substrates. Accordingly, "p-bulk" and "p-well" shall collectively refer to p-wells and p-substrates, and "n-bulk" and "n-well" shall collectively refer to n-wells and n-substrates. Transistor threshold voltages collectively will be denoted "Vt," and will be independently denoted as "Vtn" for the n-transistor and "Vtp" for the p-transistor. As used herein, "nominal bias conditions" refers to a standard operational value including ground (GND) for p-well 14 and Vdd for n-well 18.

A modification of the well bias controls transistor Vt during the testing. In particular, increased Vtn is generated by decreasing the p-bulk bias from a nominal value; decreased Vtn is generated by increasing p-bulk bias from a nominal value; increased Vtp is generated by increasing the n-bulk bias from a nominal value; and decreased Vtp is generated by decreasing n-bulk bias from a nominal value. Decreasing Vt strengthens the transistor, and increasing Vt weakens the transistor.

The testing may include voltage-based testing, static leakage current IDDQ testing, and stress testing. Each type of testing will be described separately relative to a number of applications and related examples. It should be recognized, however, that the methods should not be limited to the particular testing described or the particular applications and examples other than as provided in the attached claims.

Figure 2:
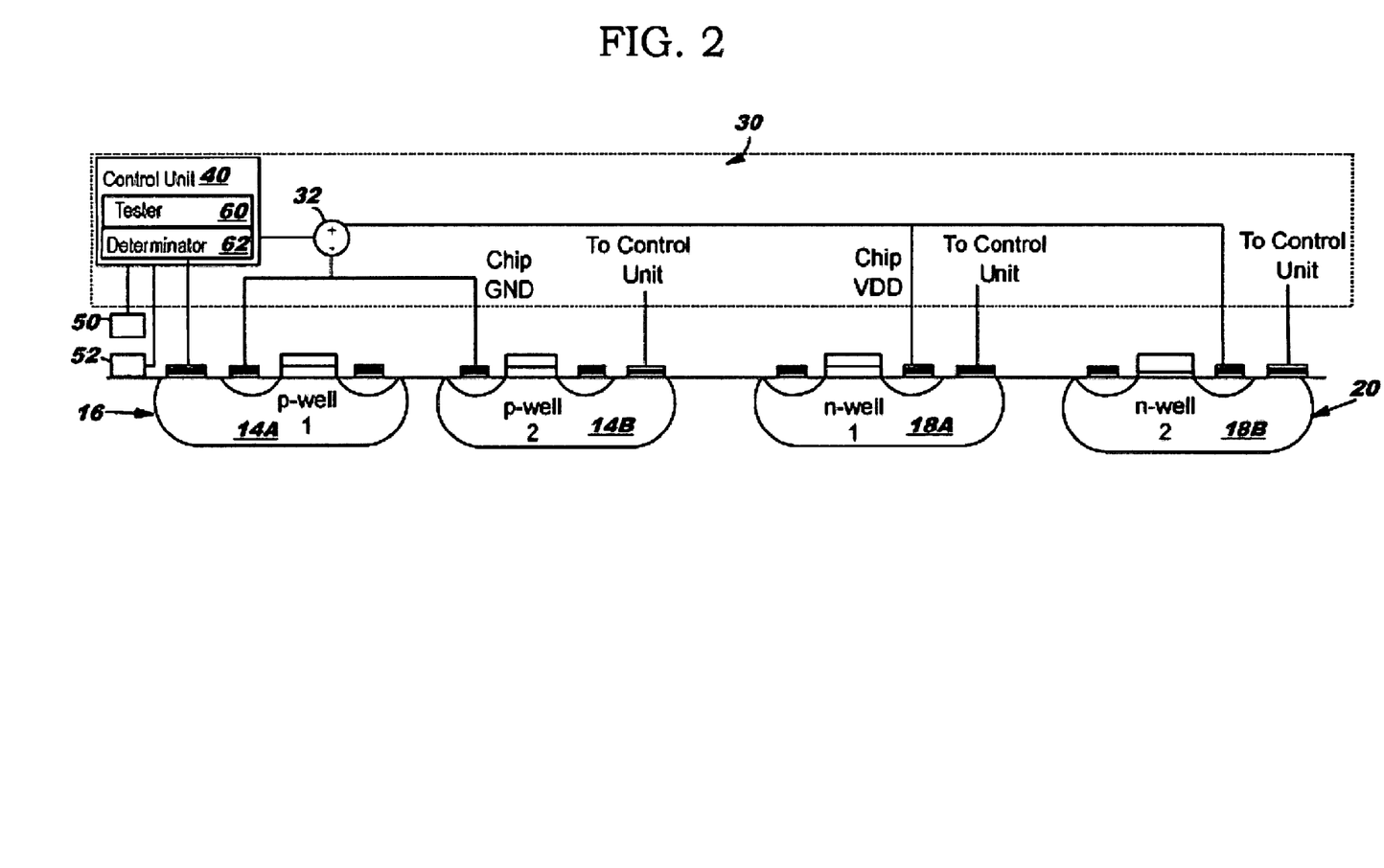
FIG. 2 shows an integrated circuit for testing including well partitions.

With continuing reference to FIG. 1, a testing system 30 for IC 10 is also shown. Testing system 30 includes a power supply 32 that has chip ground (GND) coupled to the n-transistor's source terminal 34 and VDD coupled to the p-transistor's source terminal 36. In addition, testing system 30 includes a control unit 40 having a tester 60 for testing IC 10 and a defect determinator 62 for determining whether a defect exists based on the testing. Control unit 40 controls a well bias of n-transistor 16 via a coupling 42 to its p-well 14, and a well bias of p-transistor 20 via a coupling 44 to its n-well 18. Control unit 40 may also control power supply 32. In addition, control unit 40 is programmable to determine defects based on the testing. Although not shown for clarity, as known to those skilled in the art, IC 10 may be positioned in a burn-in oven for stress testing as will be described below. In addition, it should be recognized that while FIG. 1 only illustrates a twin-well embodiment, the teachings of the invention are extendable to use for a single well or to more than two wells. As shown in FIG. 2, wells 14, 18 can be partitioned into p-wells 14A, 14B and n-wells 18A, 18B, and each partition may be coupled to control unit 40 for separate testing according to the methods described below. Although one partition of each well is shown, it should be understood that any number of partitions may be provided. It should be recognized that FIGS. 1 and 2 are greatly simplified. For example, input protection circuitry, the multitudes of other transistors, some chip internal wiring, etc., are not shown for clarity purposes.

As will be illustrated in the Applications/Examples that follow, the determining step according to the methods may include comparing outputs of the circuit to expected results for a defect-free circuit, which may be stored in control unit 40. Alternatively, the determining step may use the circuit as its own reference. That is, comparing the circuit's output for a certain test to a reference output of the same circuit under different well bias conditions. Defect detection can be determined based on theoretical predictions and/or empirical data.

Testing may take a variety of general forms. In one embodiment, testing may include modifying the well biases to one of a plurality of extreme conditions, e.g., minimum n-well bias and maximum p-well bias, or maximum n-well bias and minimum p-well bias or other permutations. In terms of this testing, the determining step may observe the well-bias extreme conditions in isolation. Alternatively, during the extreme condition testing, the determining step may include observing a circuit parameter in addition to well bias during the testing. A "circuit parameter" may be any circuit function that may be observed during testing such as chip speed as measured by ring oscillator frequency, chip speed as measured by scan chain flush delay, minimum VDD where the chip operates to specifications, maximum VDD where the chip operates to specifications, static leakage current, average dynamic power consumption, etc. In addition, "circuit parameters" may also include quantities that can be controlled during test including, for example, VDD, temperature and clock speed. Testing may also include modification of at least one of the circuit parameters, e.g., chip speed, Vdd, temperature, etc. In any case, the determining step may include comparing results to expected results at extreme conditions.

With special regard to when partitions are provided (FIG. 2), the modifying step may include applying a different well bias condition to at least one partition 14A compared to at least one other partition 14B, and the determining step may be applied to IC 10 as a whole or on a partition-by-partition basis. Alternatively, the modifying step may include applying a plurality of different well bias conditions to a plurality of different partitions 14A, 14B, 18A, 18B, and the determining step may include comparing the results of the testing to one another to localize a defect.

The description includes the following headers for clarity purposes only: I. Voltage-based Testing, II. IDDQ Testing; III. Stress Testing; and IV. Miscellany.

I. Voltage-based Testing

Voltage-based testing using the invention includes implementing now known or later developed techniques for such testing with modification of well bias. For example, conventional voltage-based testing may include applying a test vector by, for example, stimulating IC 10 through primary or scan chain inputs 64, 66 (FIG. 1). A "test vector" may be, for example, binary data generated by well-known automatic test pattern generation software. Conventional voltage-based testing continues by propagating the effects to logically observable points (e.g., primary outputs 70, 72 or scan chain latches 64, 66) and comparing the results to an expected outcome. The method of modifying the well bias during test (e.g., during the application of the test vector and propagation to logically observable points), however, enhances the detectability and diagnosability of manufacturing defects. For example, a higher threshold voltage Vt for the transistors makes the transistors weaker, i.e., gives them a higher equivalent resistance. In this case, a short (defect) resistance, for example, remains constant, so the short looks more severe and is more easily detected. Voltage testing at a low-Vdd similarly enhances defect detection by weakening transistors, but this test provides neither strengthening transistors to enhance detection nor strengthening or weakening the n-transistor or p-transistor independently of one another. There are some unique defects that testing with independently modified well bias can detect that low-Vdd cannot.

Illustrative applications of how well bias can be modified during voltage-based testing, and related illustrative examples of defects that can be better detected with each application will now be discussed.

Application 1: Decreasing Transistor Threshold Voltage

Decreasing a transistor's Vt can enhance the detectability of some defects. Note that the following examples illustrate how defect detectability can be enhanced by making the transistors stronger rather than weaker during test, as is done in the well-known low-Vdd test technique referenced above.

EXAMPLE 1

Dynamic Node Leakages

If there is a high-resistance short type defect between a dynamic floating node and a signal line connected to the drain of an active n-transistor 16 (FIG. 1), the discharge of the node will be strongly affected by the RC constant determined by the equivalent resistance of n-transistor 16 and the capacitance on the dynamic node. Decreasing Vt will decrease the equivalent resistance of n-transistor 16 and therefore make the discharge faster and, therefore, easier to detect. Note that increasing Vdd would similarly decrease the equivalent resistance of n-transistor 16, but would present a higher charge Q to be discharged in the first place (charge Q=capacitance C times Vdd), which makes detection harder.

EXAMPLE 2

Open Transistor Gate

Open transistor gates can cause delay faults in circuits. For example, when using an open n-transistor gate in an invertor: when the inverter input is low, the p-transistor turns on while the n-transistor gate couples to its drain and turns on as a weak load. In that test condition (input driven low), detection is enhanced by the Vtn being decreased. With a decreased Vtn, n-transistor 16 presents a stronger load (lower equivalent resistance), which reduces the inverter output and makes the degraded high output easier to detect. Note that increasing Vdd would also make n-transistor 16 present a stronger load, but also makes p-transistor 20 stronger, which makes detection more difficult. Note also for this example that it is useful to be able to control Vtn and Vtp independently. In this case, making n-transistor 16 load stronger without making p-transistor 20 stronger enhances defect detection.

Application 2: Independently Changing Vtn and Vtp

Independently changing Vtn and Vtp can enhance detection of defects in some circuits by changing voltages on defective nodes, changing logic gate thresholds, and changing critical path composition.

EXAMPLE 1

Independently changing Vtn and Vtp can uniquely detect some circuits with defects by changing the voltage on the defective node. For example, one may have a signal-to-signal resistive short defect between a large p-transistor and a small n-transistor, where the only observation point is at the drain of the p-transistor. In this case decreasing Vtn but not Vtp, reduces the voltage on the observed node from above the driven gate's logic threshold to below it, allowing for observation of the defect since an incorrect (low) voltage must be observed at that node for detection. Decreasing Vtn but not Vtp could be accomplished by increasing p-well 14 bias, but leaving n-well 18 bias at its nominal value. Detection would be further enhanced by increasing Vtp to reduce the voltage on the observed node even further due to an even better (higher) strength ratio between the n-transistor and p-transistor. Increasing Vtp could be accomplished by increasing n-well 18 bias from a nominal value. Such a defect could similarly be detected by decreasing Vtn and/or increasing Vtp and then applying a voltage-based timing test (i.e., a voltage test run at a speed close to maximum for the IC), in which case there would be a less restrictive requirement on the degraded node's voltage.

EXAMPLE 2

Modifying one well bias to increase or decrease a respective Vt, but not the other well bias, or increasing a respective Vt while decreasing the other, changes the logic threshold of gates in the circuit. Modifying both well biasesnts together can also change logic thresholds, but modifying each independently can be used to achieve a much more dramatic effect. Defects (especially difficult-to-detect ones) generally cause degraded logic levels. Changing the logic thresholds, the gate or gates driven by a degraded logic level could cause a circuit to go from passing to failing, or vice versa. Changing VDD also changes logic gate thresholds, but modifying Vtn and Vtp separately gives a great deal of control. For example, consider a floating node whose voltage is determined by capacitive coupling to VDD and GND. Independently modifying Vtn and Vtp can make the logic level seen by the driven gate go from '1' to '0,' and vice versa.

EXAMPLE 3: Modifying Vtn and Vtp will change the critical paths of the circuit and thereby enhance detection of timing defects. Timing defects allow the circuit to function correctly at slow speeds, but cause the circuit to fail when it is run at fast speeds, e.g., speeds at or close to the rated speed. This is especially the case when Vtn and Vtp are modified independently. For example, delay tests are in general hampered by the fact that long paths can hide timing defects in short paths. Modifying Vtn and/or Vtp changes the relative lengths of paths. Individual control of the transistor thresholds provides great flexibility for lengthening nominally short paths and shortening nominally long paths such that timing defect coverage is enhanced without additional patterns.

In one embodiment, the method as applied to Application 2 may be implemented by using well bias modification to modify threshold voltages Vts to: (a) strengthen p-transistor 20 and weaken n-transistor 16 by decreasing the p-well 14 bias for n-transistor 16 and decreasing n-well 18 bias for p-transistor 20; (b) strengthen n-transistor 16 and weaken p-transistor 20 by increasing p-well 18 bias for n-transistor 16 and increasing n-well 18 bias for p-transistor 20; or (c) strengthen both transistors by increasing p-well 14 bias for n-transistor 16 and decreasing n-well 18 bias for p-transistor 20. The determination of defects can occur with any setting above.

More complex testing regimens may also be implemented. For example, the following regimen may be implemented:

first setting each well bias at a nominal value; second increasing p-well 14 bias from a nominal value and setting n-well 18 bias at a nominal value; and third setting p-well 14 bias at a nominal value and decreasing n-well 18 bias from a nominal value. The determining step would occur between each of the above steps. The above-described regimen may further include: fourth setting p-well 14 bias to a lower than nominal value and n-well 18 bias to a higher than nominal value; fifth setting p-well 14 bias to a lower than nominal value and n-well 18 bias to a lower than nominal value; and sixth setting p-well 14 bias to a higher than nominal value and n-well 18 bias to a higher than nominal value. Again, the determining step would occur between each of the above steps. It should be recognized that other combinations of n-well and p-well biases could also be used. A search could also be done for the minimum and/or maximum of each well bias at which the chips will still operate. The n-transistor and p-transistor searches could be done together or independently. The minimum or maximum well bias could be compared to circuit parameters such as the chip minimum/maximum operating VDD or IC speed as determined by, for example, a ring oscillator, i.e., a set of circuits with an odd number of inversions used to monitor IC speed, or by measuring a maximum frequency (Fmax) at which the IC will function.

Application 3: Simultaneously Modifying Well Bias And Other Controllable Circuit Parameters

EXAMPLE 1

Some defects can be uniquely detected by simultaneously modifying VDD and Vt together. For example, some cross talk is best detected with high VDD (large crosstalk) and low Vt (low noise margins).

EXAMPLE 2

Characterizing VDD versus well bias behavior for a circuit may detect unique problems such as the crosstalk example above, and also may help to distinguish between defects (i.e., test-based failure analysis). As used herein, "characterization" means comparing of two parameters in such a way as to discern differences.

EXAMPLE 3

Applying a low-VDD test and Vt modification at the same time can also provide advantages. For example, circuits that are weakened (and therefore made more sensitive to defects) by low-VDD can be further weakened (and therefore made more sensitive) by increasing Vt. If the circuit cannot tolerate weakening by increasing both Vtn and Vtp, it may tolerate weakening just one, which will enhance detection. In this case, a low-VDD test and Vt modification can aid test resolution, which is normally limited because minimum VDD for a circuit is limited by the weakest block. In other cases, circuits might not be able to function with the transistors any weaker than that provided during the low-VDD test, in which case the techniques that decrease Vtn and/or Vtp (i.e., strengthen the transistors) combined with the low-VDD test are especially valuable. In particular, circuits can be weakened by low-VDD and then a modified well bias used to change parameters such as defect-related degraded circuit voltages and logic gate thresholds, as described above. The defect-detection effect of the latter modifications will be enhanced by the circuit's low-VDD weakened state. In some instances, characterizing minimum VDD versus maximum well bias can aid achieving process insensitivity in test results.

Application 4: Characterizing Well Bias Behavior Versus Other Observable Circuit Parameters Comparison tests can also be applied. For example, at least one extreme condition setting for a well bias can be tested and defects determined. For example, one of a minimum or maximum well bias attainable versus a speed at which the IC will function may be used to detect defects. In this case, the minimum and/or maximum well bias at which the IC functions at a particular speed can be determined, and then compared to a predetermined goal. The "goal" can include a value for the minimum and/or maximum well bias attainable. Again, IC speed may be measured by ring oscillators, or by measuring a maximum frequency (Fmax) at which the IC will function. Similar to the minimum VDD, the maximum well bias at which the circuit works should depend on things that also affect IC speed. Using well bias modification during test gives a new independent dimension (i.e., a new "lever") for these comparison tests.

Application 5: Using a Chip's Own Well Bias Behavior as a Reference

The chip under test can act as its own reference during test and diagnosis. That is, the circuit's output for a certain test can be compared to a reference output of the same circuit under different well bias conditions. On a good chip, changing Vts a small amount should not change the test results, e.g., the logic values observed at scan chain latches or primary outputs 70, 72 (FIG. 1) should not change. On a defective chip, the logic values may change as a result of phenomena such as changing logic gate thresholds or changing values of degraded voltages, etc., as described above. In this case, the chip can be used as its own reference by comparing the test results obtained with the test run under one set of well bias conditions to those obtained with the test run at a different set of well bias conditions. Accordingly, a predetermined set of expectation data for comparison is no longer required.

Application 6: Bump or Retention Testing

EXAMPLE

Bump or retention type testing using well bias as the weakening mechanism. This technique can be advantageous for random access memory (RAM) retention testing, e.g., a cell with a missing p-transistor will eventually flip to its preferred state. Threshold voltage (well bias) modification can be used to make the flip happen faster, thereby decreasing the time required for retention testing. In the case of "bump" testing, the testing step may include stimulating the circuit with a test vector, as discussed above, followed by the step of modifying the well biases for a predetermined time. Determination of a defect then includes observing the test vector.

Application 7: Separate Well Partitions

Referring to FIG. 2, separate well partitions (e.g., n-well is partitioned and/or p-well is partitioned) provide additional advantages for test and diagnosis. Testing may include applying a different well bias to at least one partition compared to at least one other partition. The determination of a defect may then be applied to the circuit as a whole or on a partition-by-partition basis. For example, any of the tests outlined in the Applications or EXAMPLES above may be applied on a partition-by-partition basis. In another example, a differential-extreme-operating-well-bias scheme may be applied from partition-to-partition. Additional variables may be provided for critical path modification and changing logic thresholds, if paths cross well bias boundaries. In terms of overall advantages, the requirements that the whole circuit work at certain conditions, e.g., well bias conditions, the same VDD, etc., may be relaxed using partitions. Further, test resolution provided by being able to test each partition against its own expected tolerable modified-Vt conditions may be enhanced. Diagnosis achieved by modifying Vt in different partitions independently, including localizing to a partition or, if paths cross partition boundaries, localizing to a path segment possibly using "chip-as-its-own-reference" diagnosis techniques, may also be provided.

Another advantage of well bias modification during voltage-based testing is that test techniques that decrease Vt do not require a reduced test speed as do such methods as decreased VDD.

The above described voltage-based testing using well bias modification may be implemented using various structural features.

First, well bias modification may be implemented by controlling the bias of the bulk during testing using control unit 40. For cases where there is only a single electrically connected n-well and a single electrically connected p-well, control mechanisms can be implemented. For example, binary control at test for whether the substrate is at the circuit VDD (GND) or a modified VDD (GND) may be implemented. In this case, options include, for example: a direct pin-out control signal, or a test pad available only at the wafer test or via a register bit under scan chain control. Alternatively, control (at least binary) of the n-substrate and p-substrate independently may be implemented. Control allowing both increases and decreases in the substrate voltages versus nominal voltage may be implemented. Full analog control of the well bias voltage may also be provided by, for example, a direct pin-out, a test pad available only at the wafer test, or a control register under scan chain control plus a digital-to-analog converter (DAC). The above control mechanisms may be implemented independently of the chip, or as integrated bias control circuits as known in the art.

Second, where multiple well partitions are provided, separate bias control can be implemented for testing. A multiple well bias partition methodology would be natural where parts of the circuit are active while other parts are idle. For some test and diagnosis methods described above, a design methodology where wells are partitioned, e.g. an application specific integrated circuit (ASIC) methodology where well-islands are geographically defined, may be advantageous.

The above-described applications of well bias modification during voltage-based testing make defects more detectable by decreasing (strengthening transistors) instead of increasing Vts (weakening transistors); independently controlling Vts for n-transistors separately from those for p-transistors; using relationships between Vt and minimum operating VDD or other measurable or controllable circuit parameters for defect detection and circuit characterization; taking advantage of separately-wired well partitions, if they exist; and using Vt modification for enhancing diagnosis.

II. IDDQ Testing

A transistor's well bias has a strong effect on its threshold voltage Vt, which in turn has a strong effect on its static leakage current IDDQ. The methods described below provide both increases and decreases in threshold Vt to exploit the relationship between well bias and IDDQ rather than just using well bias to decrease IDDQ. In addition, the methods allow characterization of multiple independent relationships by modifying Vtn and Vtp independently. In general, the methods rely on measuring IDDQ at two or more well bias conditions and comparing the inferred relationship between IDDQ and well bias to the relationship expected for a defect-free circuit. Compared with methods that compare IDDQ at different supply voltages VDD, well bias modification allows: a wider range of IDDQ testing without damaging the device with large electric fields across the gate oxide, characterizing multiple independent relationships by modifying Vtn and Vtp separately, and increases the ability to induce jumps in IDDQ due to degraded logic levels exceeding lowered transistor thresholds or falling below increased transistor thresholds.

Relative to IDDQ testing, the method may include the steps of: applying a test vector, applying a first set of biases to n-well 18 and p-well 14 (e.g., through control points 42, 44—FIG. 1), measuring the IDDQ, applying a different second set of biases to the wells, and measuring IDDQ again. The results of the IDDQ testing under the multiplicity of well bias conditions are then compared to expected results for a defect-free circuit to determine whether a defect exists. Note that the test vector can be applied with the chip under either nominal or modified well bias conditions. It can optionally be applied and re-applied prior to setting the desired well biases and measuring the IDDQ. The steps of modifying well bias-measuring IDDQ can be repeated for different test vectors. What is determined to be "expected results" may be generated by empirical analysis of a number of tests for many chips. The application and measuring steps may be repeated a number of times prior to the comparison. There are a number of ways of comparing the results to determine whether a defect exists using modified well bias IDDQ testing.

A. Relationships Comparison

In one embodiment, defects can be detected by comparing general relationships between IDDQ of a defect-free circuit and that of a defective circuit using well bias modification. For example, a difference, i.e., a "delta," in IDDQ when the well bias is modified can be detected when a degraded voltage on a node moves from being below the driven transistor's Vt to above it. In another example, IDDQ may include one or more large changes or "jumps" in value as the well bias varies smoothly, indicating a defect.

EXAMPLE: A defect exists in the form of an unintentionally open node. The voltage of the open node is determined by the voltages on a neighboring wire. Assume that the neighboring wire always happens to be at the correct voltage for the open node during the test such that the open node voltage is on the correct side of the logic threshold of the driven gate, but is degraded. Assuming the open node is at a degraded logic 0, as long as the degraded voltage 0 has a voltage less than Vtn in the driven gate, there will be no defect-related IDDQ. However, if Vtn is decreased to a value below the voltage on the degraded node during the test, there will be a jump in IDDQ. In contrast, in a defect-free chip, the node on which the unintentional open node occurs in the circuit will have a value of approximately 0 V, i.e., less than the decreased Vtn. In that case, there will be no similar jump in IDDQ. Accordingly, the defect is more easily detected.

With further regard to the above EXAMPLE, note that in contrast to turning on IDDQ by decreasing a Vt, turning off IDDQ by increasing a threshold voltage Vt can also lead to a jump in IDDQ that would be absent for a defect-free chip. For example, the degraded voltages at the ends of a resistive signal-line-to-signal-line bridge can cause "fan-out current" in the driven gates. Such fan-out current could be turned off by increasing one or more transistor thresholds Vt in the driven gates, causing an unexpected decrease in the IDDQ. In a defect-free circuit, there would be no fan-out current and therefore no similar decrease in IDDQ. Accordingly, the defect is more easily detected.

B. Curve Shape Comparison

In another embodiment, the process may implement an IDDQ curve shape or graphical comparison by: establishing an IDDQ curve shape(s) for a defect-free circuit (e.g., with a point-by-point model or modeling the curves as linear or exponentials) and an IDDQ curve shape for a circuit under test, and comparing the IDDQ curve shapes. Establishing an IDDQ curve shape for a defect-free circuit may include measuring IDDQ at different sets of well biases for many chips. Similarly, establishing the IDDQ curve shape for the circuit under test may also include measuring IDDQ at different sets of well biases.

Figure 3:
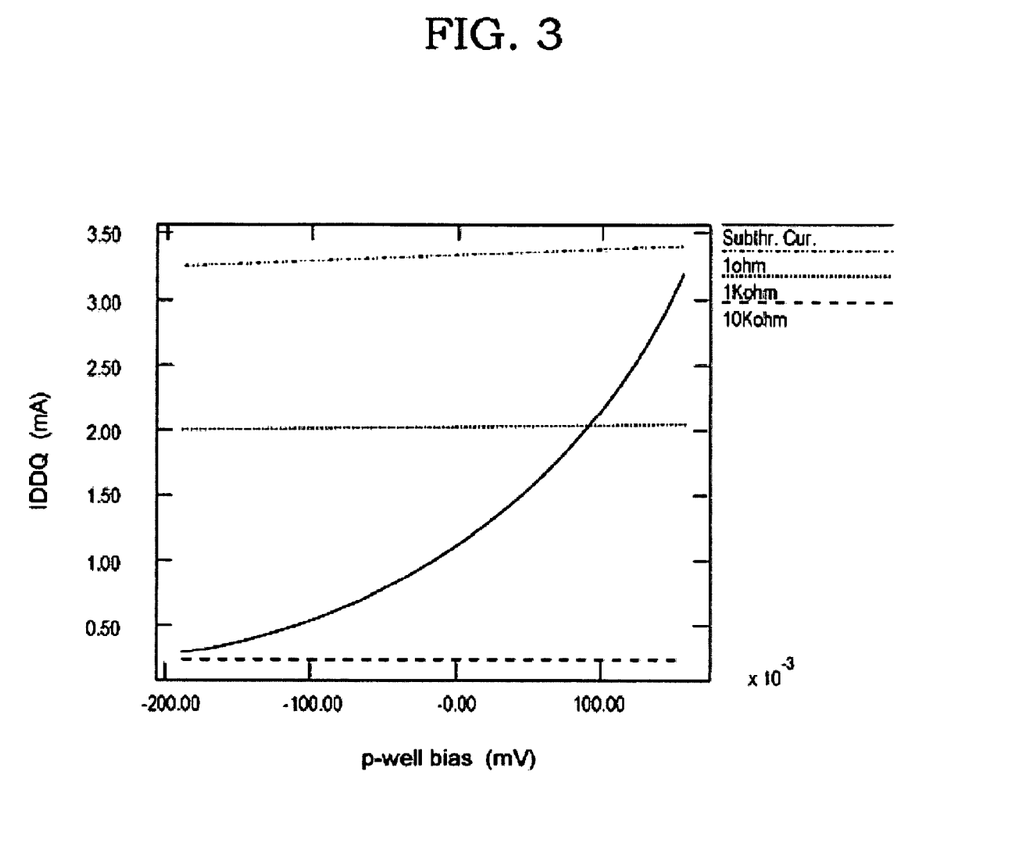
FIG. 3 shows a graph for detecting defects during IDDQ testing according to an embodiment of the invention.

FIGS. 3-4 illustrate the benefits of this technique. In this case, different p-well biases were applied to a circuit and the resulting IDDQ was measured. The circuit used to build the illustration was a standard cell inverter with a resistor modeling a short from the output to VDD. Of course, the technique can be applied to any circuit. From the measurements, a graphical representation is generated as shown in FIG. 3. In FIG. 3, the p-well 18 bias is presented in milli-Volts (mV) along the horizontal axis, and the IDDQ is presented in milli-Amperes (mA) along the vertical axis. The dotted curves, i.e., lines, show the results for defect resistances of 1 ohm (top dashed line), 1 Kohm (middle dashed line), and 10 Kohms (bottom dashed line). The solid curve represents the same relationship for a defect-free static leakage current IDDQ. Note that the defect-related IDDQ curves have flat shapes, which makes them easy to distinguish from the exponential shape of a defect-free IDDQ curve. The 10 Kohm curve is almost entirely flat because the IDDQ in the sample circuit is determined by the defect resistance. Regardless of the well bias, there is approximately VDD across the defect resistance, so the current is independent of the well bias. In the 1 ohm case, the IDDQ is limited by the transistor, so the curve shown reflects the dependence of the transistor's saturation current on the well bias. While the well bias does have an effect on drain saturation current (IDsat), i.e., theoretically approximately quadratic, the shape of the defect curves are still easily distinguished from the exponential defect-free IDDQ curve.

Figure 4:
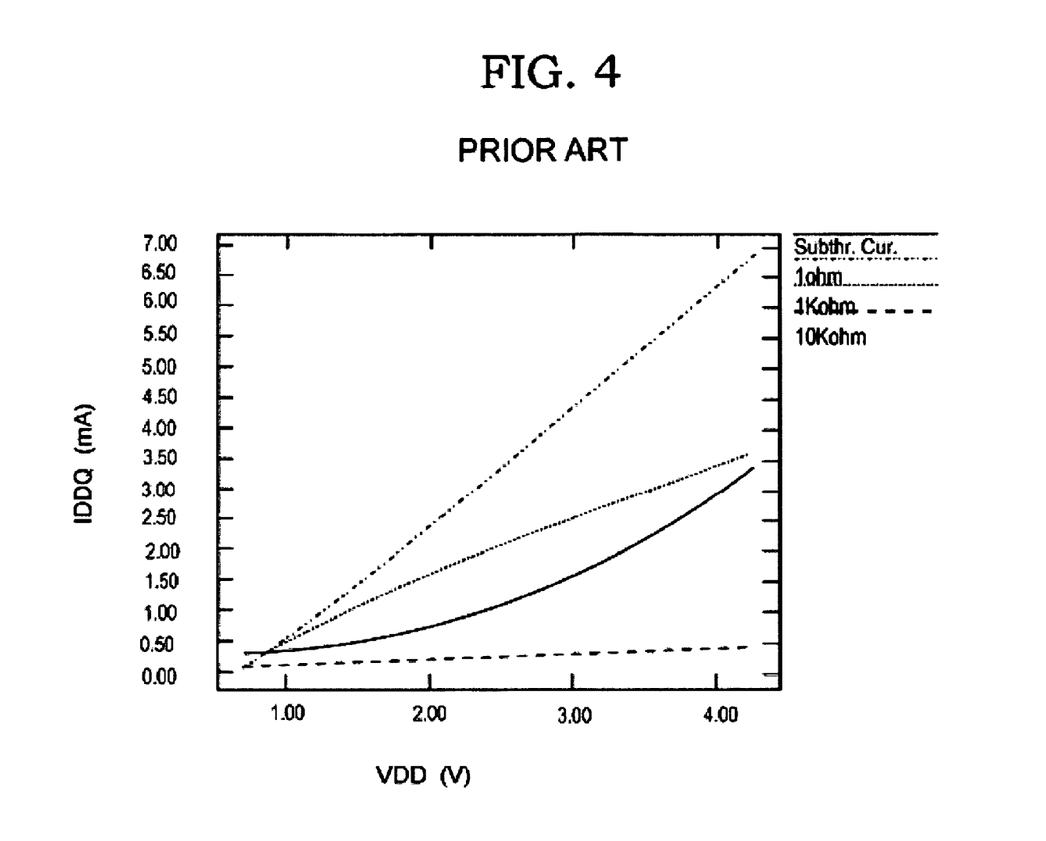
FIG. 4 shows a prior art graph illustrating the difficulties of detecting defects during IDDQ versus Vdd testing.

For comparison, FIG. 4 shows a prior art graph illustrating the difficulties of detecting defects using the relationship between IDDQ and VDD for the same circuit. In this graph, IDDQ is presented in milli-Amperes (mA) along the vertical axis, and VDD is presented in volts (V) along the horizontal axis. Again, dashed lines represent a circuit with a defect, and solid lines represent a defect-free IDDQ curve. In this example, the defect-free IDDQ curve is varied over approximately the same range as in FIG. 3. However, in this case, the defect-related IDDQ curves have shapes much closer to the defect-free IDDQ curve. Accordingly, more easily distinguished curve shapes are generated by modifying the well bias (FIG. 3) compared to an IDDQ versus VDD technique (FIG. 4).

C. Outlier Rejection Techniques

Another embodiment may include performing testing some number n pre-determined well bias settings, and use n-dimensional outlier rejection techniques to identify defective circuits. Outlier rejection techniques function to locate samples that do not fit the native, i.e., defect-free, distribution.

With regard to the comparison embodiments above, the separate wiring of n-well 18 and p-well 16 allows the well bias and hence the Vtn(s) and Vtp(s) to be adjusted independently. This ability can be beneficial, for example, because it can provide two different characteristic relationships to compare against. This would be especially helpful in the case where IDDQ versus well bias characteristics is quite different between n-transistors and p-transistors. For example, where one transistor's results are more representative of a defective circuit relationship than the other. Separate wiring also allows changing of the circuit state by modifying logic thresholds without changing any other inputs.

Well bias modification can also be used to effectively turn off, or at least substantially decrease, one type of IDDQ, i.e., n or p, and then perform a variety of characterizations on the other type versus at least one circuit parameter. Such characterization might include current versus voltage, current versus temperature analysis, or current versus well bias. It could also include comparing IDDQ using one test vector versus another. Characterizing one type at a time can be expected to provide a much more uniform relationship for each element being characterized and therefore a stronger and easier to understand set of standard relationships. Such techniques could also be used to learn about the composition of the leakage current.

In another embodiment, the well-bias modification may be used as another independent variable in multi-parameter testing (e.g., IDDQ versus well-bias versus IC speed (as measured by a ring oscillator). It can also be used in characterizing IDDQ to learn about its origin. For example, defect-related IDDQ that flows through n-transistors can be distinguished from defect-related IDDQ that flows through p-transistors by strengthening only n-transistors at once and observing which modification affects defect-related IDDQ.

III. Stress Testing

Well bias modification also provides an alternative way to stress a chip and find latent defects for certain classes of circuits. For example, well bias modification allows generation of large currents for stressing a chip without application of a high and damaging electric field across the gate oxide and without necessarily relying on high temperature, i.e., without necessarily requiring a burn-in oven. In addition, because the transistor threshold voltage (Vt) has a strong effect on both switching and static transistor currents, the method allows tuning the well biases during stress to achieve the desired mix of static and switching currents. Accordingly, it provides a method for improved circuit stress compared to standard voltage stress and burn-in stress techniques. In addition, the method also helps circuits function at stress conditions and allows for localizing and diagnosing defects. The methods can be used to "bump" gate oxide stress and tailor well bias on a chip-by-chip basis during burn-in. As with voltage-based testing and IDDQ testing, partitions are also beneficial relative to stress testing.

Application 1: Current Control

Transistor switching currents are strongly dependent on threshold voltage Vt based on the well-known simplified equation $I_{DSsat}=K*W/2 \, L(VgS-Vt)^2$, where K is the transistor transconductance parameter, W is the transistor width, L is the transistor length, Vgs is the voltage difference between the transistor's gate and source nodes, and Vt is the transistor threshold voltage. In particular, modifying well bias modifies Vt and therefore modifies switching currents. As described above, an aim of stressing chips is to generate large switching currents. Modifying well bias uses Vt decreases during stress to achieve that goal. Using low Vt instead of high VDD creates high currents without putting a high and damaging electric field across the gate oxide. In addition, using low Vt to generate the current could help avoid false defects due to crosstalk, which is more severe under voltage stress elevated VDD than it is under nominal VDD. Modifying well biases to modify switching currents can be done: (1) as a stress mechanism itself in the absence of elevated temperature or voltage, (2) during voltage-based stressing, or (3) during burn-in stressing, where "burn-in stressing" usually connotes high-temperature stressing and sometimes high temperature and high voltage stressing.

Transistor subthreshold leakage currents are also strongly sensitive to Vt, according to the simplified equation, $I_{DSsub}=W/L*I_{d0}*e^{(Vgs-Vt)/nV'}$, where W is the transistor width, L is the transistor length, $I_{d0}$ is a process parameter related to the transistor transconductance and is independent of Vt, Vgs is the voltage difference between the transistor's gate and source nodes, Vt is the transistor threshold voltage, n is a constant process parameter typically around 2, and V' equals kT/q in which k is Boltzmann's constant, T is temperature in Kelvin and q is the charge of an electron. In particular, increasing Vt decreases static leakage current IDDQ. As described above, another important element of stressing chips is to control the power drawn. Modifying well biases uses Vt increases to decrease subthreshold leakage during stress to achieve that goal.

Finally, design compromises are often required to get circuits to work under stress (elevated voltage and/or temperature) conditions. Modifying well biases allows using Vt modification during stress to aid circuits in working under burn-in conditions.

Well bias modification can be applied on the tester or in the burn-in oven. In addition, it can be used as the sole stress mechanism or in combination with elevated voltage and/or temperature. The choice depends on the target defects to be accelerated. Further, where a burn-in oven is in use, many circuits may be stressed at once, and the current drawn and temperature of each circuit can be monitored individually. In addition, the well biases can be set individually.

Well bias modification during stress testing can be used as a simple or sophisticated control mechanism for switching current or static current during on-the-tester stress or during burn-in. Examples of simple current controls include: always decreasing transistor Vts during voltage-based stressing to enlarge switching currents; or always increasing transistor Vts during burn-in stressing to decrease the static leakage currents.

More sophisticated current controls may include:

EXAMPLE 1

Tailoring Well-bias Control on Chip-by-Chip Basis

Threshold voltage Vt can be adjusted in the burn-in oven to obtain the desired amount of switching current without unnecessary static leakage current. To implement this strategy, the switching currents drawn by a chip during burn-in would be monitored and Vt adjusted such that the chip draws a predetermined desired amount of switching current that would in most cases be the same for each chip. Short channel chips would naturally draw large switching current and therefore allow a higher Vt setting than longer channel chips. The relatively high Vt setting would control the static leakage current, which also would be expected to be higher on the shorter channel chips. Long channel chips, on the other hand, would require setting Vt lower. The current measurement and Vt control signal generation could be done within the burn-in tester.

Because chip temperature is strongly determined by static and switching currents, which in turn are strongly dependent on well bias through its effect on Vt, well bias can also be used to control temperature. For example, the temperature of each chip could be monitored, e.g., via a sensor external to the chip 50 (FIG. 1) or an on-chip sensor 52 (FIG. 1) like a thermistor, and the well bias(es) controlled by control unit 40 (FIG. 1) to maintain a desired stress test temperature. Decreasing VDD would achieve a similar current-limiting effect. Using Vt adjustment, however, provides two advantages. First, unlike VDD, threshold voltage Vt itself provides no stress. Accordingly, there is no defect-acceleration loss associated with increasing Vt. Second, increasing Vt has a strong effect on both switching and subthreshold leakage currents. VDD, on the other hand, has a strong effect on only switching currents. VDD's effect on subthreshold leakage current IDDQ is relatively weak, being only through the Drain Induced Barrier Lowering (DIBL) effect.

EXAMPLE 2

Switching Well Bias

Switching the well bias during burn-in or voltage stress so that the Vts are low when the circuit switches and high when circuit does not switch provides high peak switching currents as a stress mechanism while limiting static leakage. This process may include, for example, increasing p-well 14 (FIG. 1) bias and decreasing n-well 18 bias when circuit switching is to occur; and decreasing p-well 14 bias and increasing n-well 18 bias when circuit switching is not to occur. Limiting the static leakage current diminishes the power requirements and helps prevent chip temperature rise and thermal runaway. Switching well bias during burn-in could be done by synchronizing the Vt voltage with the clock.

EXAMPLE 3

Setting Vt Differently During High Voltage Burn-in Versus Nominal Voltage Burn-in Where a high voltage stress is desired but not required for the entire length of the burn-in, leakage current could be controlled during an elevated voltage portion of the burn-in by setting Vt high. Thereafter, generation of large switching currents during a non-elevated-voltage portion of the burn-in (by setting Vt low) could occur.

Application 2: Aid Circuit Functionality During Burn-in

Well bias modification to control Vt can also be used to help circuits to function under burn-in operating conditions. One reason circuits fail to function at elevated VDD during burn-in is that path delay becomes more RC dominated than it is at nominal VDD. The change occurs because the transistors speed up, but the interconnect does not. That change in path delay composition may lead to the violation of critical race conditions. For example, to prevent violation of a latch hold time, data must not arrive at the latch input until a specified amount of time after the clock arrives at the clock input. If the data path is gate-delay-dominated, while the clock distribution network is wire-delay-dominated, the hold time may be violated under elevated-VDD conditions due to speeding up of the data path relative to the clock distribution path. Under nominal conditions, there may not be a hold time violation. Ideally the circuit would not need to be timed to work at out-of-spec VDDs. To relax that requirement, Vt could be increased when the circuit is run at elevated VDD. The increase in Vt would counter the transistor speed-up, have no effect on the interconnect delay and, therefore, keep the path delay composition closer to that appearing under nominal circuit operating conditions.

Another reason circuits might not function at burn-in conditions is that high temperatures cause increased leakage currents, which may cause dynamic nodes to lose their charge too quickly and therefore cause the circuit to fail. To avoid design concessions to eliminate the problem, one could increase Vt during burn-in, which would decrease the leakage currents and therefore counter the high-temperature effect. Similarly, high temperature conditions lead to problems with VDD droop because of the increase resistivity of the metal power grid. Lowering switching currents by increasing Vts during all, or part, of burn-in mitigates the VDD droop and prevents designers from having to accommodate VDD droop during burn-in.

EXAMPLE: Independent control of Vtn and Vtp may be exploited to find operating conditions where the circuit can function. For example, to help dynamic nodes maintain charge, only Vtn may be increased, while Vtp remains at a nominal value.

Application 3: Partitions

As noted above relative to IDDQ testing, circuits with wells wired separately from circuit VDD and GND may have just a single shared p-well node and a single shared n-well node, or the p-well and n-well nodes may themselves be partitioned. If the wells are partitioned, as shown in FIG. 2, stress conditions can be controlled on a partition-by-partition basis, which can be useful for such things as relaxing the constraint that all partitions of the circuit must be able to function under the same stress conditions. In addition, the Vt-induced high-current stress can be applied to only part of the circuit at a time to minimize the power requirement. Even if the wells are not partitioned, n-transistor and p-transistor Vt can be lowered one at a time to minimize stress from the power requirement.

Partitioned wells can also aid with defect localization. Specifically, "temporary" stress defects, i.e., those that cause circuit malfunction only under stress and not under normal operational conditions, can be localized to a partition. The localization may be done by repeatedly running the stress test with just one or a subset of the partitions seeing the stressful well bias conditions. The partition containing the defect can be identified as the one whose being in the stressful condition causes the failure, i.e., test failure or circuit malfunction. If this process is completed methodically during test, stress-related permanent defects could also be localized to a partition. Assuming the partitions cannot be tested independently, such a localization would require serially stressing each partition and checking for a defect. The localization could not be done in a post-processing step because once the stress defect becomes permanent, the defect would be present no matter which partition is put into the stress condition.

If paths cross well bias partitions, the fail site can be further localized to a sub-path within one partition. In addition, even if the wells are not partitioned, temporary defects where the current flows through n-transistors can be distinguished from temporary defects where the power flows through p-transistors by decreasing only Vtn or Vtp one at a time. Controlling Vt during stress can also help with defect characterization, or "test-based-failure-analysis." Specifically, problems sensitive to high currents can be distinguished from those due to high fields by testing at both increased VDD and decreased Vt.

Application 4: High Electric Field Gate Oxide Stress

To accelerate some defects, e.g., gate oxide defects, to failure, it may be desirable to put an elevated electric field across the gate oxide for some portion of the circuit stress. For n-transistors whose p-well 14 voltages are nominally at GND potential, lowering the p-well voltage provides such an increased electric field. The same is true for p-transistors with the polarities reversed. Note that using well bias modification to achieve the elevated electric field has the advantage over increasing VDD to achieve the elevated field because it is much quicker to apply. Specifically, changing the power supply voltage VDD is a slower operation than changing the well-bias voltage. Also, whereas increasing VDD causes the circuit to draw greater static leakage current, well bias modification decreases the static leakage current drawn and, therefore, the static power consumed during gate oxide stress. In one embodiment, the well-bias would be bumped to the stress setting in synchronization with the clocking of the circuit. For example, well biases would be set to nominal conditions just prior to the clock switching and then set to the stress biases just after the clock switches for the remainder of the (probably lengthened versus nominal) clock period. Providing these steps would maintain nominal conditions during circuit switching, which would avoid the requirement for the circuit to operate correctly under the stress conditions. Note that a similar bump type stress would be much less practical with a VDD modification instead of a Vt modification strategy because, as noted above, changing the power supply voltage VDD is a much slower operation than changing the well bias.

The above-described application of well bias modification during stress testing controls static leakage during burn-in, but also takes advantage of being able to control dynamic switching current, not just static current. Moreover, the technique involves increasing that current as a stress mechanism in itself. Selective control of both static and dynamic current during the same circuit stress is also advantageous. Instead of just using the well bias as a blanket method for decreasing power during burn-in, adjusting conditions to both optimally stress the circuit and control power at once is advantageous. The technique can be tailored on a chip-by-chip basis during burn-in and also provides an alternative means for gate oxide stress. This technique also has extensions in terms of diagnosis and circuit functionality during burn-in.

IV. Miscellany

It should be recognized that while the methods have been described relative to particular steps that not all steps form the invention as outlined in the attached claims. In addition, in many cases, the particular order of steps disclosed can be changed without departing from the scope of the invention.

In the previous discussion, it will be understood that the method steps discussed may be performed by a processor, such as CPU of control unit 40, executing instructions of program product stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

INDUSTRIAL APPLICABILITY

The invention is useful for testing integrated circuits.

What is claimed:

1. A method for testing an integrated circuit (10) having wells (14, 18) that are wired separately from circuit VDD and ground, the method comprising the steps of:
    testing a circuit including independently modifying a p-well (14) bias of an n-transistor (16) and an n-well bias (18) of a p-transistor (20);
    storing a result of the testing in a control unit; and
    determining whether a defect exists from the stored result of the testing.

2. The method of claim 1, wherein the wells (14, 18) include partitions, the modifying step includes applying a plurality of different well bias conditions to a plurality of different partitions, and the determining step includes comparing the results of the testing to one another to localize a defect.

3. The method of claim 1, wherein the determining step includes comparing outputs of the circuit to expected results for a defect-free circuit.

4. The method of claim 1, wherein the determining step includes comparing outputs of the circuit to results for the same circuit under different well bias conditions, and wherein the defect exists if there is no change in the outputs.

5. The method of claim 4, wherein the determining step includes observing a circuit parameter in addition to well bias during the testing, wherein the circuit parameter includes a chip speed, a minimum VDD, a maximum VDD, a static leakage current, an average dynamic power consumption, a temperature, or a clock speed.

6. The method of claim 4, wherein the testing step further includes modifying at least one circuit parameter other than well bias, wherein the circuit parameter includes a chip speed, a minimum VDD, a maximum VDD, a static leakage current, an average dynamic power consumption, a temperature, or a clock speed.

7. The method of claim 1, wherein the testing includes modifying the well biases to one of a plurality of extreme conditions, the plurality of extreme conditions including a minimum n-well bias and a maximum p-well bias, or a maximum n-well bias and a minimum p-well bias.

8. The method of claim 1, wherein the testing step further includes voltage-based testing; and the modifying step includes one of:
    (a) decreasing a p-well (14) bias for the n-transistor (16) and decreasing an n-well (18) bias for the p-transistor (20);
    (b) increasing the p-well bias for the n-transistor and increasing the n-well bias for the p-transistor; and
    (c) increasing the p-well bias for the n-transistor and decreasing the n-well bias for the p-transistor.

9. The method of claim 1, wherein the testing step further includes voltage-based testing; and wherein the determining step includes determining at least one of a minimum well bias and a maximum well bias at which the IC (10) functions at a particular speed; and determining whether at least one minimum and maximum well bias meets a predetermined goal.

10. The method of claim 1, wherein the testing includes measuring an elevated static leakage current (IDDQ) under the modified p-well bias and n-well bias conditions.

11. The method of claim 10, wherein the modifying step includes applying both increases and decreases of well bias to establish a relationship between IDDQ and well bias.

12. The method of claim 10, wherein the step of applying includes:
    applying a first set of biases to the n-well (18) and the p-well (14), and then measuring IDDQ; and
    applying a different second set of biases to the n-well and the p-well, and then measuring IDDQ.

13. The method of claim 10, wherein the determining step includes comparing the results of the applying step to expected results for a defect-free circuit.

14. The method of claim 10, wherein the determining step includes:
    establishing an IDDQ curve shape for a defect-free circuit from the applying steps;
    establishing an IDDQ curve shape for a circuit under test; and
    comparing the curve shapes.

15. The method of claim 10, wherein the modifying step includes setting a well bias to at least substantially decrease one type of IDDQ, and the step of determining includes performing a characterization of the other type of IDDQ versus at least one circuit parameter.

16. The method of claim 1, wherein the testing includes stress testing by well bias modification.

17. The method of claim 16, wherein the modifying step includes modifying well bias to modify switching current.

18. The method of claim 16, wherein the modifying step includes modifying well bias to modify current during at least one of burn-in stressing and high-voltage stressing.

19. The method of claim 16, wherein the modifying step includes modifying well bias to draw a predetermined amount of at least one of switching and static current.

20. The method of claim 16, wherein the modifying step includes:
    increasing the p-well bias and decreasing the n-well bias when circuit switching is to occur; and
    decreasing the p-well bias and increasing the n-well bias when circuit switching is not to occur.

21. The method of claim 16, wherein the modifying step includes setting well-bias at a first setting during high voltage burn-in and a second setting during nominal voltage burn-in.

22. The method of claim 16, wherein the modifying step includes setting well-bias during burn-in to maintain circuit functioning.

23. The method of claim 16, wherein the modifying step includes setting well-bias to maintain a stress test temperature.

24. The method of claim 16, wherein the modifying step includes modifying well bias during stressing to accelerate defects by placing an elevated electric field across a gate oxide of the circuit.

* * * * *